United States Patent [19]

Lindstedt et al.

[11] 4,242,664

[45] Dec. 30, 1980

[54] REMOTE CONTROL ARRANGEMENT

[75] Inventors: Guenter Lindstedt; Wilfried W. Gehrig, both of Freiburg, Fed. Rep. of Germany

[73] Assignee: ITT Industries, Inc., New York, N.Y.

[21] Appl. No.: 933,014

[22] Filed: Aug. 11, 1978

[30] Foreign Application Priority Data

Aug. 19, 1977 [DE]  Fed. Rep. of Germany ....... 2737467

[51] Int. Cl.³ ............................................ H04Q 9/00
[52] U.S. Cl. ............................. 340/168 S; 332/11 R; 375/23
[58] Field of Search ............ 340/168 R, 168 B, 168 S, 340/171 R, 148, 167 A, 167 R; 332/11 R; 375/23

[56] References Cited

U.S. PATENT DOCUMENTS

| 3,686,634 | 8/1972 | Malchman et al. | 340/167 A |
| 3,855,575 | 12/1974 | Leuschner et al. | 340/171 R |
| 3,890,581 | 6/1975 | Stuart et al. | 332/11 R |
| 3,990,047 | 11/1976 | Sachs et al. | 340/167 R |
| 4,099,163 | 7/1978 | Worley et al. | 340/168 B |
| 4,121,198 | 10/1978 | Tsuboi et al. | 340/171 R |

*Primary Examiner*—Donald J. Yusko
*Attorney, Agent, or Firm*—John T. O'Halloran; Peter C. Van Der Sluys

[57] ABSTRACT

The invention provides remote control methods and arrangements using pulse code modulation for transmission as in infrared remote control arrangements. A primary feature is that only one quartz oscillator is necessary and is used in the receiver part. The receiver measures the first pulse width transmitted and, dependent on that, defines the measure period of a control circuit. A further feature is that each remote control word is preceded by a prepulse and a postpulse with a threefold pulse width.

4 Claims, 3 Drawing Figures

REMOTE CONTROL ARRANGEMENT

The present invention relates to a remote control arrangement as described in the preamble of claim 1. A remote control arrangement of this kind is known in principle from German Published patent application No. 2,503,083, where it is used for infrared remote control.

Apart from these known remote control techniques which are based on the principle of pulse-code modulation, remote control techniques are known in which the individual commands are characterized by signals whose frequencies differ by a constant amount. Such remote control techniques are used particularly for ultrasonic remote control, cf., for example, the periodical "Radio mentor Electronic", 1975, pages 347 to 349. From that prior art it is known that both the oscillator serving as the time basis for the transmitter and the oscillator serving as the time basis for the receiver are crystal oscillators, i.e., both oscillators have a small relative frequency change. It is also known from that prior art to provide in the receiver a check circuit for the period of the received ultrasound signal, whereby interfering frequencies outside the frequency band occupied by the signal frequencies can be eliminated.

It is obvious that the compulsion to use two crystal oscillators in a remote control arrangement involves a relatively great expense, even taking into account that use can be made of chrominance-subcarrier crystals, which are relatively low in cost because they are mass-produced. The object of the invention is to improve a remote control arrangement of the kind set forth in the preamble of claim 1 so as to eliminate the above-mentioned compulsion and nevertheless permit safe and simple interference-and error-pulse detection and suppression. This object is achieved by the means set forth in the characterizing part of claim 1. Developments and advantageous features of the invention are characterized in the subclaims.

The invention will now be explained in more detail with reference to the accompanying drawings, in which.

Figure 1:
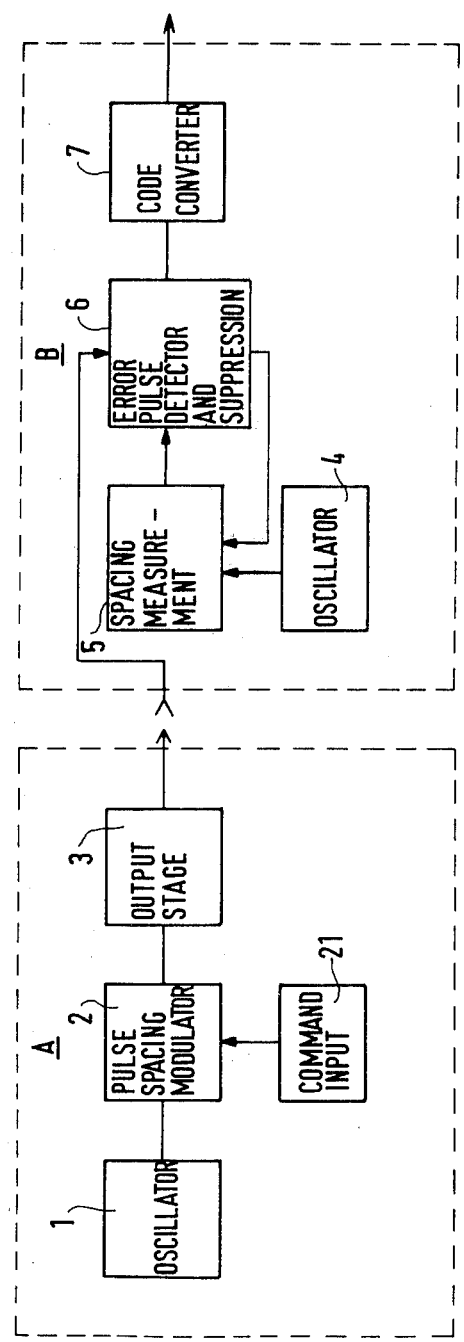
FIG. 1 is a block diagram of the remote control arrangement according to the invention.
Figure 2:
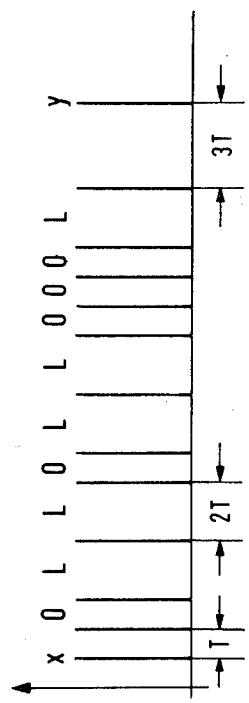
FIG. 2 shows the pulse pattern of a control command used in the invention.

The block diagram of FIG. 1 shows the transmitter A, which consists of the first oscillator 1, the pulse-spacing modulator 2, which is controlled by the command input device 21, and of the output stage 3, at whose output appear the control commands in the form shown in FIG. 2, for example, which are transmitted to the receiver B by means of a suitable transmitting medium. A transmitting medium preferably used for the arrangement according to the invention are the known infrared waves, but it is also possible to choose other transmission techniques such as ultrasonic transmission or transmission over metallic circuits.

The receiver B includes a circuit 5 for measuring the spacing of the first two successive pulses of the control command. Associated with this measuring circuit as a time base is the second oscillator 4, which determines the measuring accuracy in a known manner. The receiver B further includes the error-pulse detection and suppression circuit 6, which is fed with the received signal and through which this signal is also applied to the measuring circuit 5. The error-pulse detection and suppression circuit 6 controls the code converter 7, which converts the pulse-spacing-modulated control commands into binary information which is represented by two amplitude values and available at the converter output.

Since, according to the invention, the duration of the measured pulse spacing is used as the time base for the error-pulse detection and suppression circuit, the relative frequency change of the second oscillator 4 can be small compared to that of the first oscillator 1. This means that at least the first oscillator 1 need not be a crystal oscillator as is necessary in the above-mentioned ultrasonic remote control systems, but use can be made of simple oscillator circuits, such as LC, RC or LR oscillators. Because of the condition given for the relative frequency change of the two oscillators 1, 4, the second oscillator 4 need not necessarily be a crystal oscillator, either. If the frequency of this oscillator is chosen to be very high in view of the accuracy required, an oscillator without a crystal can be used. If, however, the choice of such high frequencies presents difficulties for other reasons, the second oscillator 4 may just as well be a crystal oscillator. In that case, therefore, only one crystal is needed in the invention, and this may be the chrominance-subcarrier crystal mentioned above.

FIG. 2 shows by way of example the control command of a practical remote control arrangement according to the invention. According to further features of the invention, the pulses, which contain the control command OLLOLLOOOL and are indicated by vertical strokes, are preceded by the start pulse x and followed by the end pulse y. It is important that the start pulse x be spaced from the first pulse of the control command the smaller of the two distances differing by a factor of 2, i.e., have the spacing T, while the end pulse y is spaced from the last pulse of the control command three time the distance, 3T. FIG. 2 also shows the assignment of the two binary states "zero", "one" to the pulse spacings. The binary "zero" is assigned to the spacing T, and the binary "one" the spacing 2T.

In the example of FIG. 2, the control command consists of ten bits, which requires eleven pulses; thus, together with the start pulse and the end pulse, thirteen pulses are transmitted per control command. The minimum total duration of the transmitted information (i.e., when the control command only contains binary zeros) is 14T, and the maximum total duration (i.e., when the control command only contains binary ones) is 24T.

The above-mentioned control-command bits can be divided so as to serve partly as address bits and partly as actual control bits. In the above-mentioned example with ten bits, four bits are used as address bits, and the remaining six as control bits, so that a total of $2^4 \times 2^6 = 2^{10} = 16 \times 64 = 1,024$ different commands can be transmitted.

Figure 3:
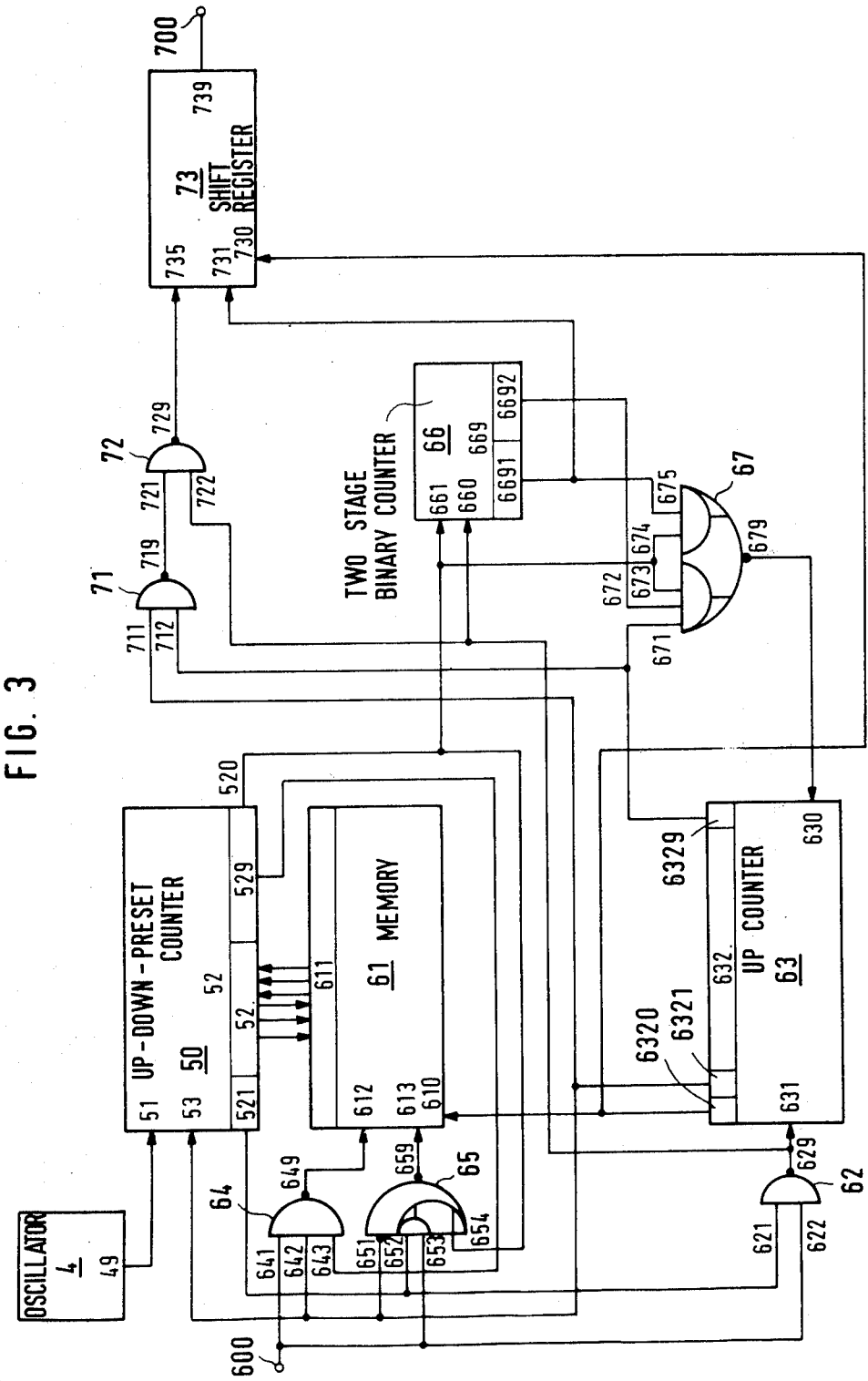
FIG. 3 is a block diagram of a preferred embodiment of the receiver.

FIG. 3 shows a block diagram of a preferred embodiment which corresponds to the above-mentioned practical circuit. The measuring circuit 5 is implemented with the up-down preset counter 50, which has its counting input 51 connected to the output 49 of the second oscillator 4 and, thus, counts the output pulses of this oscillator. This counting takes place in the forward and backward directions, the direction of count being dependent on the signal appearing at the count direction input 53. The generation of this signal will be described below.

Associated with the up-down preset counter 50 is the memory 61, in which the instantaneous count of the counter 50 is stored at given times and from which this count is read at other times and fed back into the counter 50 as a preset count. This functional relationship between the counter 50 and the memory 61 is indicated in FIG. 3 by the three arrows given for each signal direction between the count outputs 52 of the counter 50 and the parallel inputs 611 of the memory 61.

The first input 621 of the first NAND gate 62 is connected to the output 521 of a lower count range of the up-down preset counter 50, while the second input 622 is connected to the signal input 600. The output 629 of that NAND gate is coupled to the counting input 631 of the up-counter 63. The up-counter 63 thus counts the number of pulses contained in the input signal, while the up-down preset counter 50 measures the pulse spacing, i.e., the intervals between pulses.

The second NAND gate 64 has its first input 641 connected to the signal input 600, its second input 642 to the output 6321 for the count "one" of the preset counter 63, and its third input 643 to the output 529 of an upper count of the counter 50, while its output 649 is coupled to the write enable input 612 of the memory 61. The number of counts covered by the upper count range is a multiple of the counts covered by the lower count range, which is associated with the output 521. The upper count range is chosen according to the relative frequency change $\Delta f/f$ of the first oscillator 1, while the lower count range corresponds to the relative frequency change $\Delta F/F$ of the second oscillator 4.

As a result of the NAND operation performed by the second NAND gate 64, the counter 50 measures the distance between the first two pulses of each control command, i.e., the duration T between the start pulse x and the first control pulse. During the time T, a corresponding number of output pulses of the second oscillator 4 are counted forwards in the counter 50. At the end of this counting, i.e., on arrival of the first control pulse and only at that instant, the counter 50 has a count lying in the upper count range, and in response to the arrival of the pulse from the output 6321 for the count "one" of the up-counter 63, the write enable input 612 of the memory 61 is activated, so that this and only this count can reach the memory 61 via the parallel inputs 611. At the same time, since the signal from the output 6321 also activates the count direction input 53 of the counter 50, the latter is caused to count down. The counter 50 now counts the output pulses of the second oscillator 4 backwards, i.e., the duration T which is present at the beginning of each control command and depends on the instantaneous relative frequency change $\Delta f/f$ of the first oscillator 1 is made the time base for the further processing of the pulses of the respective control command.

The inhibiting first input 651 of the first multiple gate 65 is connected to the output 6321 for the count "one" of the up-counter 63, the second input 652 to the output 521 of the lower count range of the counter 50, the third input 653 to the signal input 600, and the fourth input 654 to the zero count output 520 of the up-down preset counter 50. The output 659 of this multiple gate is coupled to the read enable input 613 of the memory 61. The first multiple gate 65 combines its four inputs in a special manner as follows. The second and third inputs 652, 653 are ANDed. The output of this AND element is ORed with the third input 653. The output of this OR element is NANDed with the inhibiting first input 651.

Thus, whenever the counter 50 passes through zero, i.e., when this counter has counted down to zero or when an input pulse falls within the lower count range, the count from the upper count range previously written into the memory 61 is written into the counter 50 again, i.e., this counter is preset to the previous count. Furthermore, as a result of the logic operations performed by the first multiple gate 65, the writing just described does not take place at the first pulse of each control command (because of the connection 651/6321).

The zero count output 520 of the up-down preset counter 50 is also coupled to the counting input 661 of the two-stage binary counter 66, whose reset input 660 is connected to the output 629 of the first NAND gate 62.

The first input 671 of the second multiple gate 67 is connected to that output 6329 of the up-counter 63 which corresponds to the number of bits contained in the control command, i.e., in the above-mentioned implemented embodiment, this is the number 10. The second input 672 of the second multiple gate is connected to the output 6692 of the second stage of the two-stage binary counter 66, the third input 673 and the fourth input 674 to the zero count output 520 of the up-down preset counter 50, and the fifth input 675 to the output 6691 of the first stage of the two-stage binary counter 66, while the output 679 of this second multiple gate is coupled to the reset input 630 of the up-counter 63.

The second multiple gate 67 interconnects the five inputs as follows. The first, second, and third inputs 671, 672, 673 are ANDed, and so are the fourth and fifth inputs 674, 675, while the outputs of these two AND elements are NORed.

The two-stage binary counter counts the zero transitions of the up-down preset counter 50 and is capable of assuming the decade counts one, two or three and the binary counts 00, OL or LO, because it is reset, i.e., placed in its initial, or zero, state, on the occurrence of each input pulse. The two-stage binary counter 66 thus provides information as to whether a single, twofold or threefold pulse spacing T is contained in the control command. In the code converter 7, which will be described below, this information serves to derive the two amplitude values of the binary information.

As a result of the logic operations performed by the second multiple gate 67, the following errors in the control command, which may have developed on the transmission path, for example, are detected and suppressed:

(a) if no additional input pulse occurs after two zero transitions of the up-down preset counter 50;
(b) if, at the end of the control command, an input pulse occurs during the threefold time interval 3T after the single or twofold time interval, or
(c) if, at the end of the control command, no input pulse occurs during the threefold time interval 3T at the end thereof.

Since, with these logic operations, both the individual pulse spacings 2T and, in the cases (b) and (c), the desired number of pulses of each control command are monitored, all possible errors are detected except a double error formed by one additional pulse and one missing pulse which would have to lie between two L-bits. The occurrence of such an error results in the up-counter 63 and, hence, the other subcircuits being reset. To this end, the zero count output 6320 of the up-counter 63 is also coupled to the reset input 610 of the memory 61.

In the embodiment of FIG. 3, the code converter 7 contains the third NAND gate 71, the fourth NAND gate 72 and the shift register 73. The first input 711 of the third NAND gate 71 is connected to the output 6321 for the count "one" of the up-counter 63, while the second input 712 is connected to that output, 6329, of this up-counter which corresponds to the number of bits contained in the control command. The first input 721 of the fourth NAND gate 72 is connected to the output 719 of the third NAND gate 71, and the second input 722 to the output 629 of the first NAND gate 62, while the output 729 of this fourth NAND gate 72 is coupled to the shift-pulse input 735 of the shift register 73.

The information input 731 of the shift register 73 is connected to the output 6691 of the first stage of the two-stage binary counter 66, and the reset input 730 to the zero count output 6320 of the up-counter 63. The output 739 of the shift register 73 is coupled to the signal output 700, from which the binary code contained in the control command as the pulse spacing can be taken as the binary code of two different amplitude values. Thus, the shift register 73 is fed with the binary values corresponding to the two pulse spacings T, 2T differing from each other by a factor of 2, which binary values are shifted one place in the shift register on the occurrence of each regular input pulse.

The embodiment of FIG. 3 uses "positive logic", i.e., the binary zero is represented by a low amplitude value, and the binary one by a high amplitude value. It is, of course, possible and within the scope of the invention to use "negative logic", where the binary zero is represented by a high amplitude value, and the binary one by a low amplitude value. In that case, the individual subcircuits must be correspondingly converted according to known rules. This applies in particular to the various gates contained in FIG. 3.

The present invention is predicated, inter alia, on the discovery that for the duration of a control command, which is a maximum of about 2.5 ms (pulse spacing T about 100 $\mu$s) in the example described, the relative frequency change $\Delta f/f$ of the first oscillator is constant so that for each control command the first time interval T occurring at the beginning can, after its measurement, be taken as the time base for further evaluation, as is described above in detail.

One advantage of the invention is seen in the fact that both interference pulses contained in the received signal and falling within the lower count range of the up-down preset counter 50, and transmitted pulses not received by the receiver are detected and result in this control command being not evaluated.

What is claimed is:

1. In a remote control system of the type including a transmitter capable of transmitting a digital control command signal comprising a predetermined number of pulses, each indicative of a binary one or a binary zero, with a binary one manifesting a separation from a successive pulse of a fixed period 2T, with a binary zero manifesting a separation from a successive pulse of a fixed period T, said control signal always of a given pattern as starting with a start pulse X, a first command pulse C always following said X pulse by the period T with a fixed number of information pulses indicative of binary ones and zeroes, as determined by said fixed period separation, following said first command pulse, with a terminating end pulse Y spaced from said last information pulse by the period 3T, whereby a complete control command signal is always of the form X,C, $I_1, I_2 \ldots I_N$Y, where:

$I_1$ = first binary bit (zero or one)
$I_2$ = second binary bit (zero or one)
$I_N$ = last binary bit (zero or one)

wherein:
if $I_1$ is a zero, it is separated from $I_2$ by T, and if $I_1$ is a one, it is separated from $I_2$ by 2T,
the combination therewith of receiving apparatus for detecting said command signal as transmitted, comprising:
an oscillator circuit for providing a continuous train of pulses, each separated by a substantially smaller period than said fixed period T, with said pulse train at a given random frequency with respect to said command signal,
an up-down counting means responsive to said continuous train of pulses for counting said pulses in an up direction in a first mode and a down direction in a second mode,
first logic means coupled to said counter and responsive to said start pulse X for causing said up counter to commence counting said train of pulses in said first mode,
memory means coupled to said up-down counter and operative to store said count upon receipt of a control signal,
second logic means coupled to said memory means and responsive to said first command pulse C to provide said control signal to cause said memory to store said count indicative of a given number of pulses emanating from said oscillator during the period T as separating said X pulse from said first command pulse C, said logic means including means for coupling said control signal to said up-down counter to cause said counter to commence counting in said second mode,
zero detecting means coupled to said up-down counter and operative to decode an all zero state indicative of said counter counting down said period T, said detecting means including means for transferring said count as stored in said memory to said up-down counter to again cause said counter to count down from said stored count,
binary counting means coupled to said zero detecting means and responsive to said input signal to provide an output indicative of the number of all zero states manifested by said up-down counter between successive pulses of said command signal, whereby a count of one manifests the receipt of a binary zero indicative of a T pulse separation, a count of two manifests the receipt of a binary one indicative of a 2T pulse separation and a count of three manifests receipt of a terminating pulse indicative of a 3T separation,
register means coupled to said binary counting means and responsive to said input signal for storing values indicative of binary ones and zeroes as determined by said T or 2T separation, with said data as stored indicative of said information bits of said digital command signal.

2. The remote control system according to claim 1 wherein said second logic means includes an up counter operative to count the pulses in said command input signal.

3. The remote control system according to claim 1 wherein said fixed period T is approximately equal to one hundred microseconds.

4. The remote control system according to claim 5 wherein said number of command information bits C,$I_1$ ... $I_N$ is ten.

* * * * *